(12) United States Patent
Elsner et al.

(10) Patent No.: US 6,466,002 B1
(45) Date of Patent: Oct. 15, 2002

(54) METHOD FOR DETECTING A ROTATION DIRECTION IN THREE-PHASE NETWORKS

(75) Inventors: Norbert Elsner, Bubenreuth; Diethard Runggaldier, Stegaurach, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/468,370

(22) Filed: Dec. 20, 1999

Related U.S. Application Data

(63) Continuation of application No. PCT/DE98/01661, filed on Jun. 17, 1998.

(30) Foreign Application Priority Data

Jun. 20, 1997 (DE) .......................................... 197 26 231

(51) Int. Cl.⁷ .............................................. G01R 25/00
(52) U.S. Cl. ...................................................... 324/86
(58) Field of Search ............................... 324/76.11, 86, 324/108; 361/76; 340/658

(56) References Cited

U.S. PATENT DOCUMENTS 4,278,937 A    7/1981  Immler
4,670,831 A  *  6/1987  Fauvet et al. .................. 363/87

FOREIGN PATENT DOCUMENTS

| DE | 254 088 A1 | 2/1988 |
|---|---|---|
| DE | 195 25 761 A1 | 1/1996 |
| DE | 195 08 769 C1 | 8/1996 |
| EP | 0 599 648 A1 | 6/1994 |
| EP | 0 440 782 B1 | 10/1994 |

OTHER PUBLICATIONS

"Elektronischer Drehfeldanzeiger"(Electronic rotational field indicator)(Auderer), etz–b, vol. 29, No. 1, 1997, pp. 602–604.
Patent Abstracts of Japan No. 55–114963 A (Seiji et al.), dated Sep. 4, 1980.
Patent Abstracts of Japan No. 55–013868 A (Isamu), dated Jan. 31, 1980.

* cited by examiner

*Primary Examiner*—N. Le
*Assistant Examiner*—Etienne LeRoux
(74) *Attorney, Agent, or Firm*—Laurence A. Greenberg; Werner H. Stemer; Ralph E. Locher

(57) ABSTRACT

A method for identifying a rotation direction of a three-phase network includes the steps of sampling the individual phases at given times and using an evaluation algorithm to evaluate the measured values or interpolated approximate values, or only the mathematical signs of the values, in order to determine the rotation direction. In addition to the basic method for an ideal signal profile, half-wave-rectified signal profiles of individual phase conductors can preferably be evaluated. The method can advantageously be used to detect the rotation direction with a digital overload relay, using a digital signal control and/or signal processing which is already provided in the digital overload relay.

15 Claims, 4 Drawing Sheets

Cycle 1    Cycle 2

L2(Cycle 2)=L1(Cycle 1)

Cycle 3    Cycle 1

L3(Cycle 3)=L1(Cycle 1)

ved the United States.

METHOD FOR DETECTING A ROTATION DIRECTION IN THREE-PHASE NETWORKS

CROSS REFERENCE TO RELATED APPLICATION

This is a continuation of copending International Application No. PCT/DE98/01661, filed Jun. 17, 1998, which designated the United States.

BACKGROUND OF THE INVENTION

Field of the Invention

The invention relates to a method for detecting a rotation direction in three-phase networks, in which the individual phases are respectively sampled at predetermined times. The European patent document EP 0 599 648 A1 describes such a method.

An electronic rotating field indicator is described on page 602 of the reference etz-b, 29 (1977). A pulse sequence is formed in order to determine the rotation direction, and the pulse sequence is used to derive conclusions relating to "counterclockwise rotation" or "clockwise rotation" of the rotating field. Furthermore, a so-called antiphase detector is known from the Japanese patent document JP 55-13868 A2. The antiphase detector carries out a half-wave rectification.

Further, a phase detector is known from the Japanese patent document JP 55-114963 A2. The phase detector requires that all the phases must be sampled simultaneously at a number of points in time.

The German patent document DE 195 25 761 A1 describes a synchronization detection circuit having a pattern comparator. In addition, the European Patent Document EP 0 440 782 B1 describes a release or trigger system for interrupting at least a number of current paths in a polyphase network, which has a microcomputer.

The above-mentioned European patent document EP 0 599 648 A1 describes a three-phase line analyzer, which stores digital values of the signals in the three phases and, starting from a zero point, determines the positive signal series, negative signal series, and further signal series. The U.S. Pat. No. 4,278,937 A describes a circuit configuration which determines the phase sequence of a rotating field by comparing voltages of individual half waves. The German patent document DE 195 08 769 C1 describes a method for determining the direction of rotation of a three-phase system and a circuit configuration for performing the method, which determines the zero crossing of a phase while simultaneously determining the polarity of the other two phases. Using a microprocessor, the direction of rotation can be determined from a comparison of the polarities in relation to a zero point, however, determining the zero point crossing is comparatively complicated.

SUMMARY OF THE INVENTION

It is accordingly an object of the invention to provide a method for identifying the rotation direction in three-phase networks which overcomes the above-mentioned disadvantages of the heretofore-known methods of this general type and which is simple and can be automated. It is a further object of the invention to specify an advantageous use of such a method.

With the foregoing and other objects in view there is provided, in accordance with the invention, a method for identifying a rotation direction of a three-phase network, the method includes the steps of sampling individual phases of the three-phase network by alternately sampling the individual phases at given time intervals for generating measured values of the individual phases; evaluating the measured values of the individual phases with a given evaluation algorithm, the given evaluation algorithm defining a result quantity determined from the measured values of the individual phases sampled at least at two points in time; and determining a mathematical sign of the result quantity, the mathematical sign being significant for a rotation direction of the three-phase network. in accordance with another mode of the invention, the individual phases have an ideal sinusoidal profile and the mathematical sign is determined by evaluating the measured values of the individual phases during a single evaluation cycle.

In accordance with yet another mode of the invention, at least one of the individual phases has harmonics or an interference and the mathematical sign is determined by evaluating the measured values of the individual phases during a plurality of evaluation cycles.

In accordance with another mode of the invention, the individual phases of the three-phase network are sampled by alternately sampling the individual phases at a frequency of approximately nine times a network frequency.

Until now, the rotation direction of three-phase networks has often been detected using empirical methods. In practice, particularly for motor control circuits, it is necessary to equip already existing overload relays with additional functions for an operational monitoring or supervision. Such an additional function may advantageously be a rotation direction detection when the overload relay is used in three-phase networks, in order to avoid fault situations, for example when installation and modification work is carried out. Therefore, in accordance with an added mode of the invention, a digital overload relay performs the steps of sampling the individual phases of the three-phase network, evaluating the measured values of the individual phases, and determining the mathematical sign of the result quantity for detecting the rotation direction of the three-phase network.

In accordance with an added mode of the invention, the digital overload relay has a signal detection capability and/or a signal processing capability which are used for performing the steps of sampling the individual phases of the three-phase network, evaluating the measured values of the individual phases, and determining the mathematical sign of the result quantity.

With the objects of the invention in view there is also provided, a method for identifying a rotation direction of a three-phase network, which includes the steps of sampling individual phases of a three-phase network at given time intervals for generating measured values of the individual phases; evaluating the measured values of the individual phases with a given evaluation algorithm, the given evaluation algorithm describing a pattern of mathematical signs of the measured values sampled at least at two points in time; and deriving an unambiguous statement about one of a counterclockwise rotation and a clockwise rotation from a totality of mathematical sign changes of the measured values.

In accordance with another mode of the invention, the individual phases of the three-phase network are alternately sampled for generating the measured values.

In accordance with yet another mode of the invention, the individual phases are sampled at a given frequency, the given frequency differing by less than 30%, and preferably less than 15%, from three times a network frequency.

In accordance with a further mode of the invention, a digital overload relay is used to perform the steps of sampling the individual phases, evaluating the measured values, and deriving the rotation direction.

The object of the invention is achieved, according to the invention, in a first alternative, in that the individual phases are sampled alternately at predetermined time intervals, and in that a predetermined evaluation algorithm is used to evaluate the individual phases. The evaluation algorithm defines a result value or result quantity which is determined from measurement values of the individual phases sampled at least at two points in time. The mathematical sign of the result value is significant for "counterclockwise rotation" or "clockwise rotation" of the three-phase current.

In a second alternative, the individual phases are sampled at given time intervals and are evaluated by a predetermined evaluation algorithm, such that the evaluation algorithm describes a pattern of the mathematical sign of the measurement values, which are determined by sampling at least at two points in time. A clear statement regarding "counterclockwise rotation" or "clockwise rotation" can be derived from the totality of the mathematical sign changes of the measurement values.

An advantageous feature of the invention is that the individual phases are sampled alternately, or all three phases are sampled within a short measurement time interval, at predetermined time intervals. The measurement time interval may be, for example, 100 $\mu$s. Particularly in a three-phase network, the sampling frequency may be approximately three times the network frequency.

According to the invention, a single evaluation cycle may be sufficient, particularly if there is an ideal sinusoidal profile. Such an evaluation cycle includes at least three measurement times.

According to a preferred embodiment of the first alternative of the invention, rectified signal profiles of the individual phases are evaluated. In this case, the individual phases may be half-wave (single-way) or full-wave (double-way) rectified.

In a preferred use, the method according to the invention is used specifically for a rotation direction detection using a digital overload relay. In this case, it is particularly advantageous that a digital signal controller and/or signal processing capability which already exists in the relay can be used to monitor the rotation direction.

For the latter use of the invention, it is now possible to determine the rotation direction in 50 Hz and/or 60 Hz networks in particular from half-wave-rectified three-phase current signals. This is particularly important since the analog portion of the signal detection which normally exists in overload relays can process only positive signals.

Other features which are considered as characteristic for the invention are set forth in the appended claims.

Although the invention is illustrated and described herein as embodied in a method for detecting the rotation direction of three-phase networks, the use of this method, and an associated digital overload relay, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
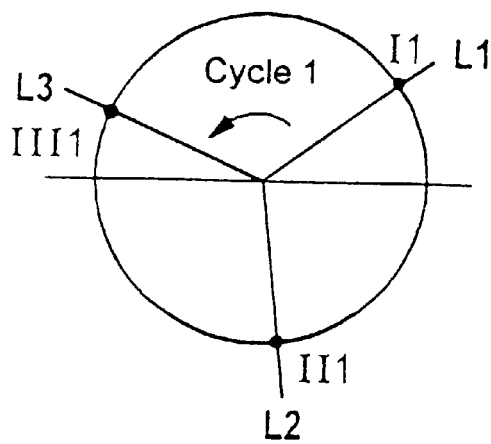
FIG. 1 are vector diagrams illustrating the principle of a rotation direction detection in a three-phase network.
Figure 1:
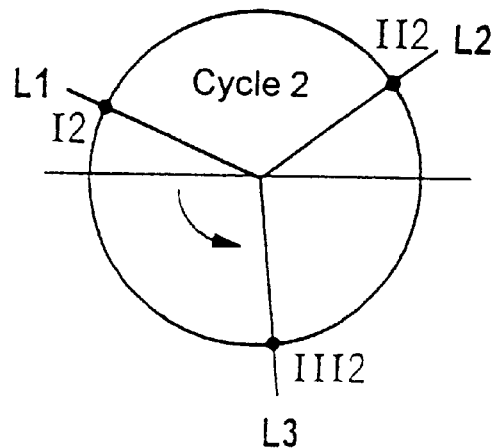
Figure 1:
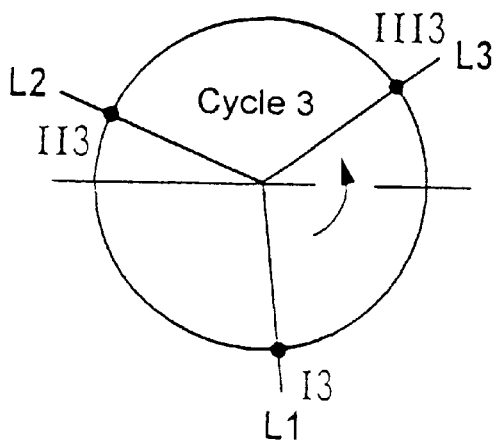

Referring now to the figures of the drawings in detail and first, particularly, to FIG. 1 thereof, there are shown vector diagrams for three successive measurement cycles I, II and III for detecting the rotation direction in a three-phase network. The example shows a counterclockwise rotation, in which the cycle frequency is three times the network frequency. In detail, this relates to the evaluation of the measured values in a suitable form in the corresponding cycles.

Figure 2:
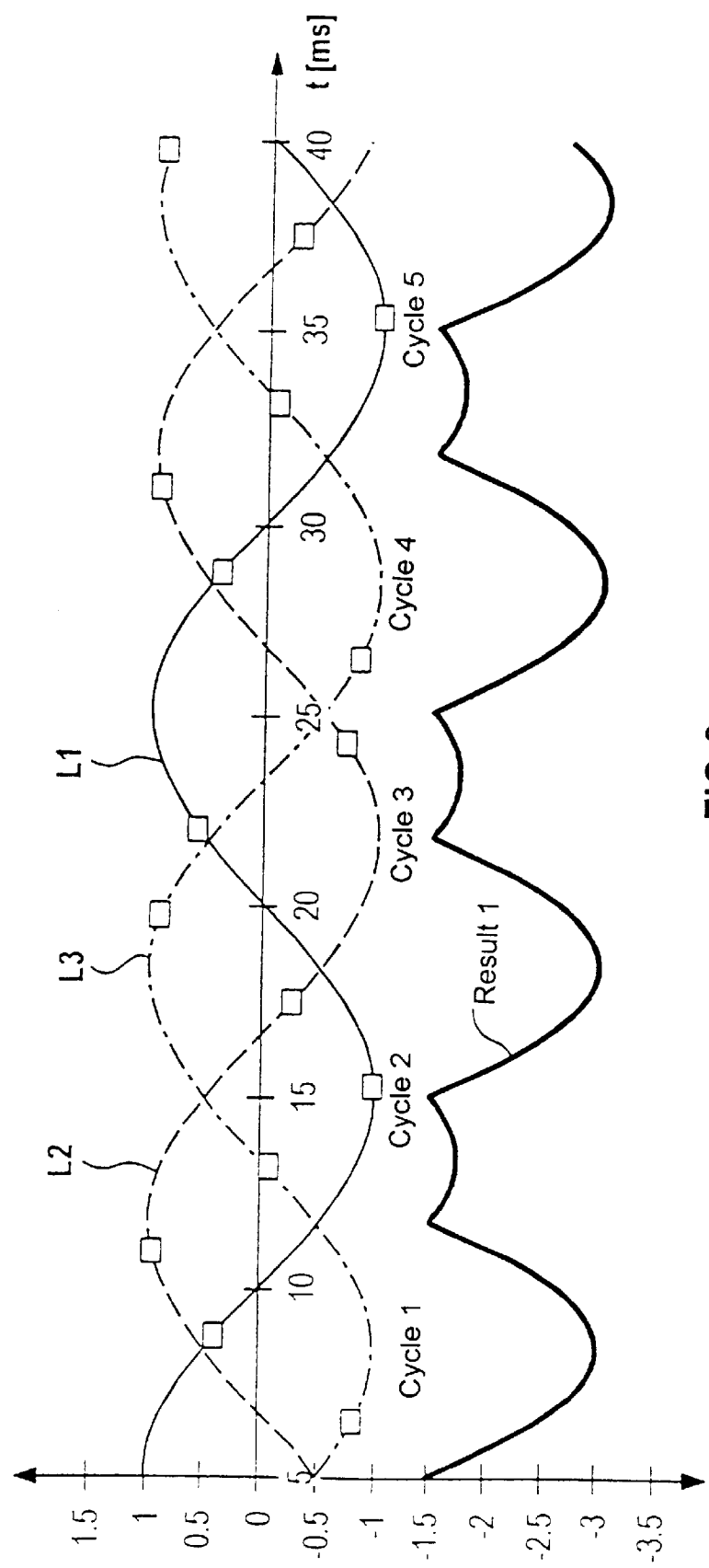
FIG. 2 diagram of the profile of the three phases with ideal sinusoidal voltages over one evaluation cycle, and an associated result value for identifying the rotation direction.

According to FIG. 2, the basic method for the rotation direction identification according to the invention uses a single evaluation cycle, in which the analog values of the three-phase current signals are measured at a cycle frequency which corresponds to three times the network frequency. The analog signal from the reference phase L1 is measured in cycle I, and the two analog signals of the phases L2 and L3 are measured in each of the cycles II and III. If the result value in one evaluation cycle is negative, then the rotation direction in the three-phase network is counterclockwise. If the result is positive, the rotation direction is, correspondingly, clockwise. The absolute value of the result value is between $1.5 * U_{phase}$ and $3 * U_{phase}$.

Figure 3:
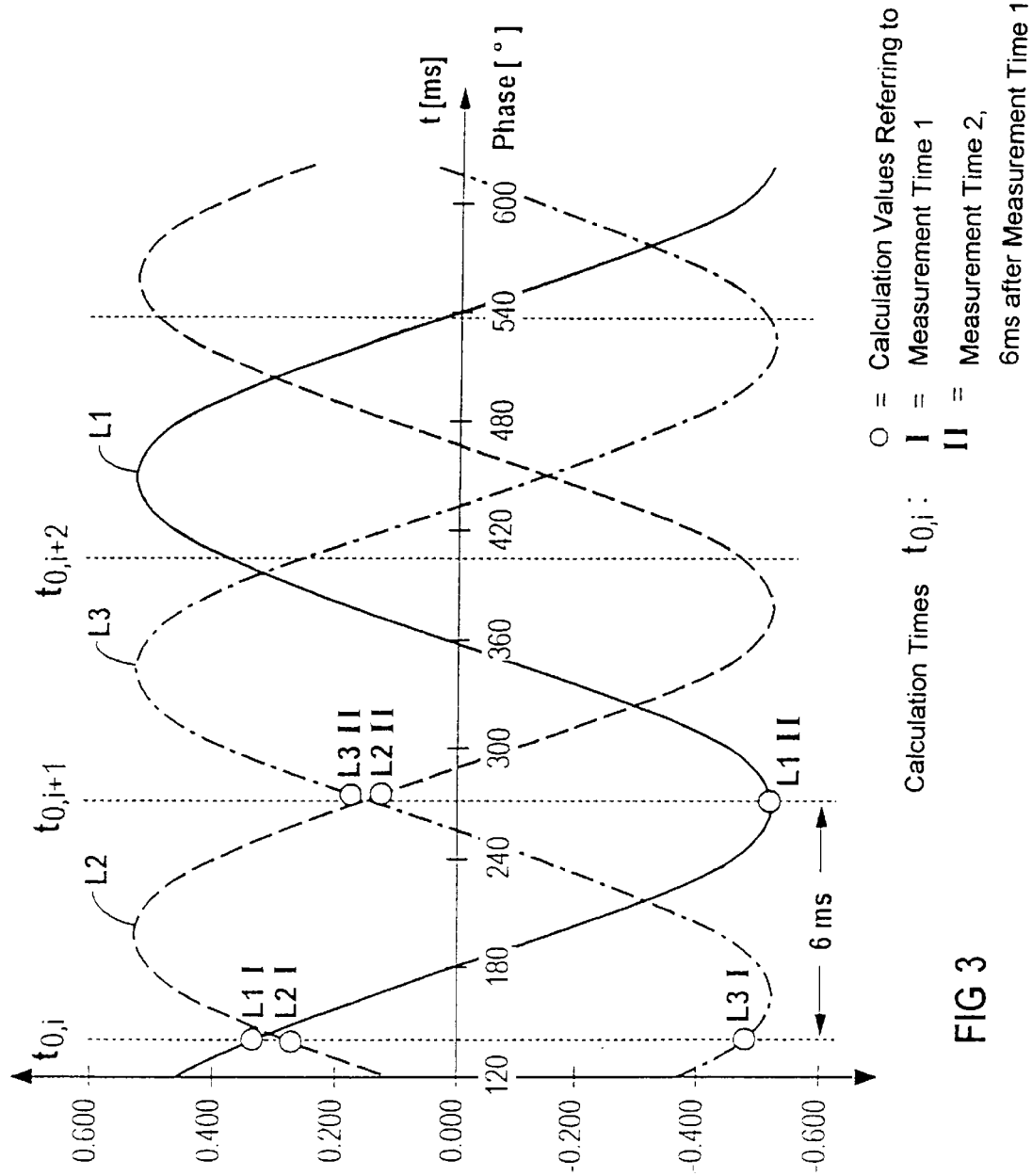
FIG. 3 is a diagram illustrating the interpolation or calculation of approximate values for phases L2 and L3 of a three-phase network.

FIG. 3 shows the signal profiles for the individual phases L1, L2 and L3 for a modified method of the first embodiment. This starts from phase L1, with the signal profiles being shown with a computation step of 1° in each case, at approximately three times the network frequency. For a time $t_0$, it is possible to obtain values approximating to the actual voltage values of L2 and L3 in each case by interpolation.

Based on the measured values and the interpolated approximate values, a suitable evaluation algorithm can be used to make a clear and unambiguous statement relating to clockwise rotation or counterclockwise rotation. The self-explanatory evaluation algorithm is described below:

Measured values L1I, L1II, L2I, L2II, L3I, L3II of network voltages in a three-phase network ($v_{network}$= network frequency) are measured at a measurement frequency $v_{meas} \approx 3 \times v_{network}$. In this case, I and II denote the two measurement times and measurement time intervals, respectively.

First Evaluation Step

1. Determination of the Mathematical Signs of the Measured Values sL1I=sign (L1I)
sL2I=sign (L2I)
sL3I=sign (L3I)
sL1II=sign (L1II)
sL2II=sign (L2II)
sL3II=sign (L3II)

2. Determination of Subsequent Evaluation Discriminant value=|sL1I−sL1II|+|sL2I−sL2II|+|sL3I−sL3II|

Second Evaluation Step:

Determination of the Rotation Direction Using the Following Algorithm

```
If value < > 4 no evaluation
else
    if SL1I − sL1II = 0
        if sL1I − sL2 II = 0 and sL2 I − sL3 II = 0
            counterclockwise rotation
            else
            clockwise rotation
        End if
    End if
    if sL2I − sL2II = 0
        if sL2I − sL3 II = 0 and sL3 I − sL1 II = 0
            counterclockwise rotation
            else
            clockwise rotation
        End if
    End if
    if sL3I − sL3II = 0
        if sL3 I − sL1 II = 0 and sL1 I − sL2 II = 0
            counterclockwise rotation
            else
            clockwise rotation
        End if
    End if
End if
```

The essential feature of the described algorithm is that the rotation direction, such as "clockwise rotation" or "counterclockwise rotation" can be identified solely from the change in mathematical sign. An automated decision can be made by storing a corresponding signal pattern.

In practice, it may be important to evaluate half-wave-rectified three-phase current signals specifically. The latter is important particularly for a digital overload relay having an existing evaluation unit, since the analog portion of the signal detection process which is provided there can process only positive signals. The second embodiment is used for a rotation direction detection in this case.

Figure 4:
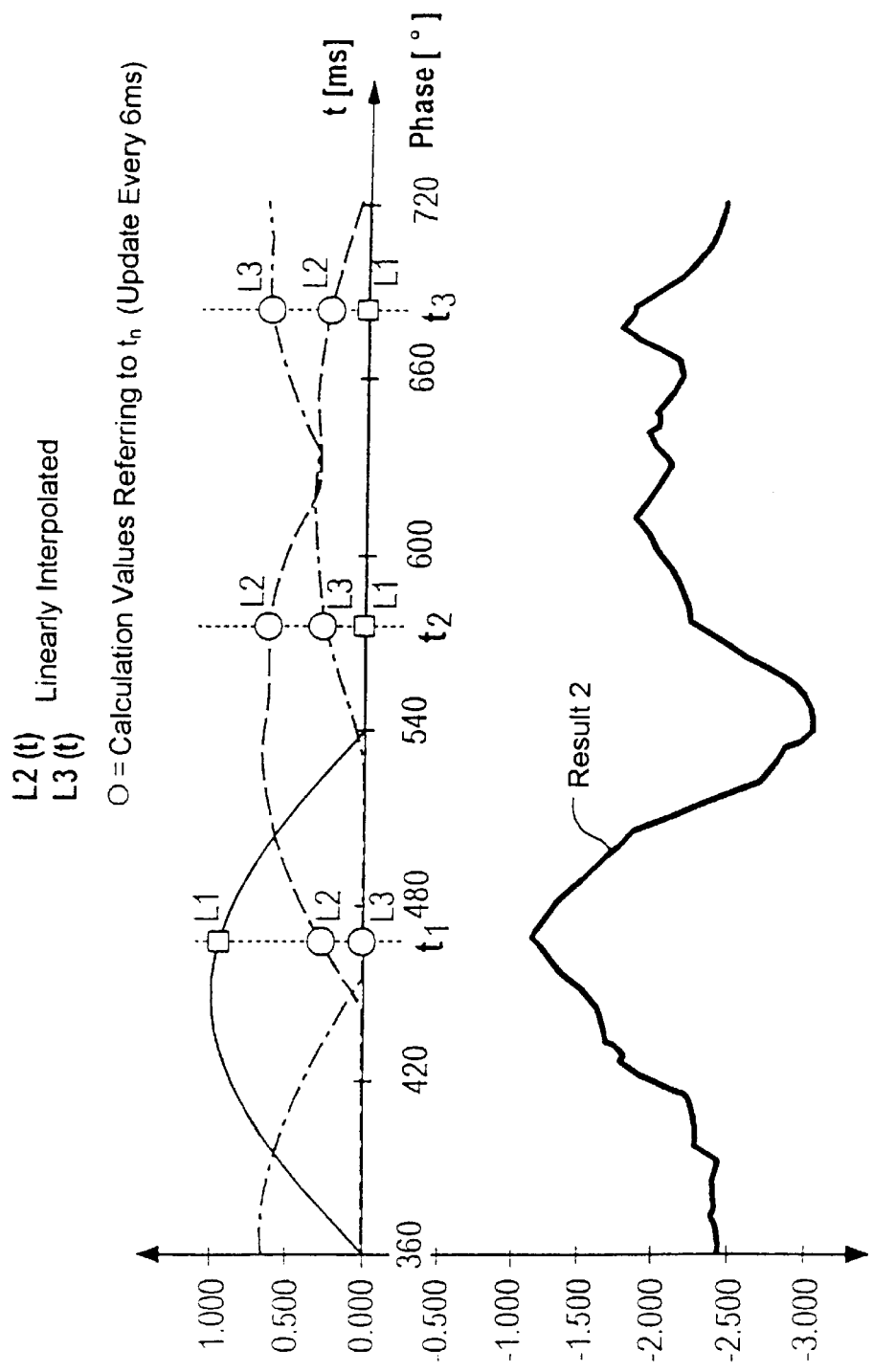
FIG. 4 is a diagram of the profile of half-wave-rectified three-phase current signals for the evaluation of the rotation direction and of the associated result value.

The signals for the profiles of the individual phases L1 to L3 are rectified in FIG. 4. As can be seen, approximate values can also be determined from the profiles of half-wave-rectified three-phase current signals by a linear interpolation for the times tn of the phases L2 and L3, if L1 is regarded as a reference phase.

FIG. 4 shows the result of a rectification. In addition to the original signal for phase L1, the graph shows the approximate profiles for phases L2 and L3, calculated by liner interpolation, for the rectified signal waveforms.

A specific calculation method can be used to identify the rotation direction from non-ideal sinusoidal curves. For this purpose, a plurality of successive evaluation cycles are used to determine the rotation direction unambiguously.

Specifically, this means that a first evaluation cycle extends from cycle 1 to cycle 3, a second evaluation cycle extends from cycle 2 to cycle 4, and further evaluation cycles extend with corresponding shifts.

It can be shown that an evaluation algorithm for a result value in accordance with the following equation is significant for determining the rotation direction.

$$\text{result} = (|L1t1-L2t2|+|L1t1-L3t3|-|L1t1-L3t2|-|L1t1-L2t3|) \text{ evaluation cycle 1}$$
$$+(|L1t2-L2t3|+|L1t2-L3t4|-|L1t2-L3t3|-|L1t2-L2t4|) \text{ evaluation cycle 2}$$
$$+(|L1t3-L2t4|+|L1t3-L3t5|-|L1t3-L3t4|-|L1t3-L2t5|) \text{ evaluation cycle 3}$$
$$+(|L1t4-L2t5|+|L1t4-L3t6|-|L1t4-L3t5|-|L1t4-L2t6|) \text{ evaluation cycle 4}$$

L1t1 ... L3t6 are signal values of the phases L1 ... L3 at the times t1 ... t6. A time period of 30 ms as well as 4 ms in each case before cycle 1 and 4 ms after cycle 6 are required for a calculation process for a 50 Hz/60 Hz network frequency. This means that a total of 38 ms is required.

The use of the above equation gives a clear result signal for an evaluation of the rotation direction, with the result value between the numerical values 1 and 3 for a clockwise rotation and between the numerical values −1 and −3 for a counterclockwise rotation, for a network frequency of 50 Hz and an original sinusoidal signal relative amplitude between −1 and +1. The effects of tolerances in the network voltage symmetry, for example variations between 0.8 and 1.2 in the relative amplitude of the network voltage and of, for example, between 45 and 65 Hz for the network frequency as well as a measurement cycle interval of, for example, between 1.7 and 2.5 ms, are not critical for the rotation direction identification. A cycle frequency of nine times the associated network frequency in each case corresponds to these limits. For normal 50/60 Hz networks, a cycle time of 2 ms is correspondingly chosen as a practical mean value for the cycle frequency 500 Hz.

Only the mathematical sign is used to determine the rotation direction: where

Sign (Result<0)→counterclockwise rotation

Sign (Result>0)→clockwise rotation

A practical embodiment of the described method is used to detect the rotation direction of a digital overload relay. It is advantageous in this case that conventional digital overload relays already have a microprocessor unit, since operating states are already processed digitally. This unit, with the mentioned components, may be used for a rotation direction detection. In consequence, no additional hardware complexity, or only a small amount of further additional hardware complexity, is required. "Counterclockwise rotation" or "clockwise rotation" may be indicated directly on an indicating unit during operation of the overload relay.

Rotational direction detection in a digital overload relay provides a useful additional function since it is possible to avoid, in particular, fault situations when installation and modification work is carried out.

In a first alternative of the generally applicable method described, the sampling frequency is advantageously around three times the network frequency, with deviations of up to about 30%, for example 15%, being possible. For the specific method in the second alternative, this results in a value of nine times the network frequency for the alternating sampling frequency.

We claim:

1. A method for identifying a rotation direction of a three-phase network, the method which comprises:

measuring alternately each individual phase of a three-phase network at a given time internal for generating measured values of the individual phases;

evaluating the measured values of the individual phases measured at least at two points in time with a given evaluation algorithm; and obtaining a result quantity with a mathematical sign, the mathematical sign being indicative of a direction of rotation of the three-phase network without needing to determine a zero point crossing.

2. The method according to claim 1, wherein the step of determining the mathematical sign by evaluating the measured values of the individual phases is performed during a single cycle of the three-phase network if the individual phases have a sinusoidal profile.

3. The method according to claim 1, wherein the step of determining the mathematical sign by evaluating the measured values of the individual phases is performed during a plurality of cycles of the three-phase network if the individual phases have harmonics.

4. The method according to claim 1, wherein the step of determining the mathematical sign by evaluating the measured values of the individual phases is performed during a plurality of cycles of the three-phase network if the individual phases have an interference.

5. The method according to claim 1, which comprises using rectified signal profiles of the individual phases.

6. The method according to claim 1, which comprises evaluating half-wave-rectified signal profiles of the individual phases.

7. The method according to claim 1, which comprises measuring the individual phases of the three-phase network by alternately measuring the individual phases at a frequency of approximately nine times a network frequency.

8. The method according to claim 1, which comprises:
providing a digital overload relay; and
performing, with the digital overload relay, the steps of measuring the individual phases of the three-phase network, evaluating the measured values of the individual phases, and determining the mathematical sign of the result quantity for detecting the rotation direction of the three-phase network.

9. The method according to claim 1, which comprises:
providing a digital overload relay having at least one of a signal detection capability and a signal processing capability; and
using the at least one of the signal detection capability and the signal processing capability for performing the steps of measuring the individual phases of the three-phase network, evaluating the measured values of the individual phases, and determining the mathematical sign of the result quantity.

10. A method for identifying a rotation direction of a three-phase network, the method which comprises:

measuring all individual phases of a three-phase network at a given time interval for generating measured values of the individual phases;
evaluating the measured values sampled at least at two points in time of the individual phases with a given evaluation algorithm obtaining a pattern of mathematical signs of the measured values; and
deriving an unambiguous statement about direction of rotation from a totality of mathematical sign changes of the measured values without needing to determine a zero point crossing.

11. The method according to claim 10, which comprises alternately measuring the individual phases of the three-phase network for generating the measured values.

12. The method according to claim 10, which comprises measuring the individual phases at a given frequency, the given frequency differing by less than 30% from three times a network frequency.

13. The method according to claim 10, which comprises measuring the individual phases at a given frequency, the given frequency differing by less than 15% from three times a network frequency.

14. The method according to claim 10, which comprises:
providing a digital overload relay; and
performing, with the digital overload relay, the steps of measuring the individual phases, evaluating the measured values, and deriving the unambiguous statement about a direction of rotation.

15. The method according to claim 10, which comprises:
providing a digital overload relay having at least one of a signal detection capability and a signal processing capability; and
using the at least one of the signal detection capability and the signal processing capability for performing the steps of measuring the individual phases, evaluating the measured values, and deriving the unambiguous statement about a direction of rotation.

* * * * *